United States Patent
Bao et al.

(10) Patent No.: US 7,839,311 B2
(45) Date of Patent: Nov. 23, 2010

(54) ARCHITECTURE FOR MULTI-STAGE DECODING OF A CABAC BITSTREAM

(75) Inventors: Yiliang Bao, San Diego, CA (US);
Toshiaki Yoshino, Fremont, CA (US);
Kai Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 138 days.

(21) Appl. No.: 12/197,133

(22) Filed: Aug. 22, 2008

(65) Prior Publication Data
US 2009/0058695 A1 Mar. 5, 2009

Related U.S. Application Data

(60) Provisional application No. 60/969,565, filed on Aug. 31, 2007, provisional application No. 61/057,009, filed on May 29, 2008.

(51) Int. Cl.
*H03M 7/00* (2006.01)
(52) U.S. Cl. .......................... 341/107; 341/51; 341/106
(58) Field of Classification Search ................... 341/51, 341/106, 107
See application file for complete search history.

(56) References Cited

U.S. PATENT DOCUMENTS

| | | | | |
|---|---|---|---|---|
| 6,917,310 B2 * | 7/2005 | Pearson et al. | ................ | 341/50 |
| 6,927,710 B2 * | 8/2005 | Linzer et al. | ................ | 341/107 |
| 7,301,485 B2 * | 11/2007 | Senda | ........................ | 341/107 |
| 2004/0085233 A1 * | 5/2004 | Linzer et al. | ................ | 341/107 |
| 2004/0260739 A1 * | 12/2004 | Schumann | .................. | 708/322 |
| 2004/0263361 A1 * | 12/2004 | Pearson et al. | ................. | 341/50 |
| 2006/0126744 A1 * | 6/2006 | Peng et al. | ............. | 375/240.26 |

FOREIGN PATENT DOCUMENTS

| | | | |
|---|---|---|---|
| EP | 1684435 A1 | * | 7/2006 |
| WO | WO 2006051796 A1 | * | 5/2006 |

OTHER PUBLICATIONS

ITU-T H.264, "Advanced Video Coding for Generic Audio Visual Services", Mar. 2005, sections 7.3.4, 7.3.5, and 9.3.

* cited by examiner

*Primary Examiner*—Khai M Nguyen
(74) *Attorney, Agent, or Firm*—John Rickenbrode

(57) ABSTRACT

Techniques for optimizing the Context-based Adaptive Binary Arithmetic Coding (CABAC) bitstream decoding are disclosed. In one configuration, a device has a first processing circuit operative to decode a Context-based Adaptive Binary Arithmetic Coding (CABAC) bitstream into an intermediate signal having a CABAC decoded standard format and a decoded order. A second processing circuit decodes the intermediate signal using a non-CABAC decoding standard. A buffer is provided between the first and second processing circuits to improve processing speeds.

27 Claims, 11 Drawing Sheets

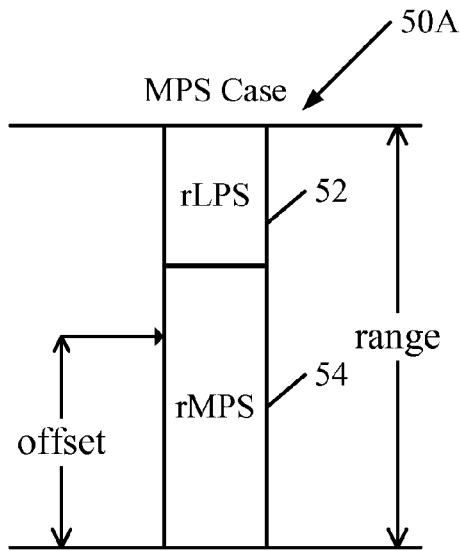
FIG. 2C
Prior Art
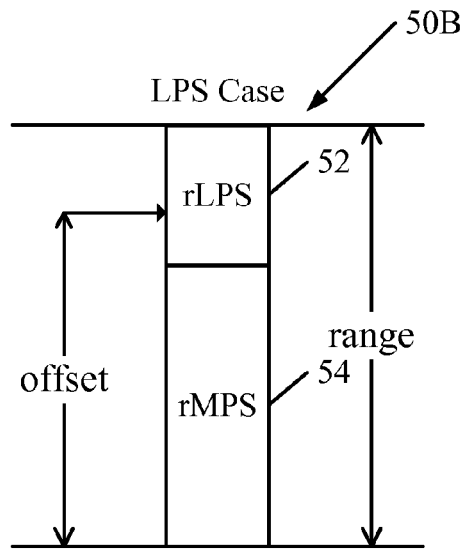
FIG. 2D
Prior Art
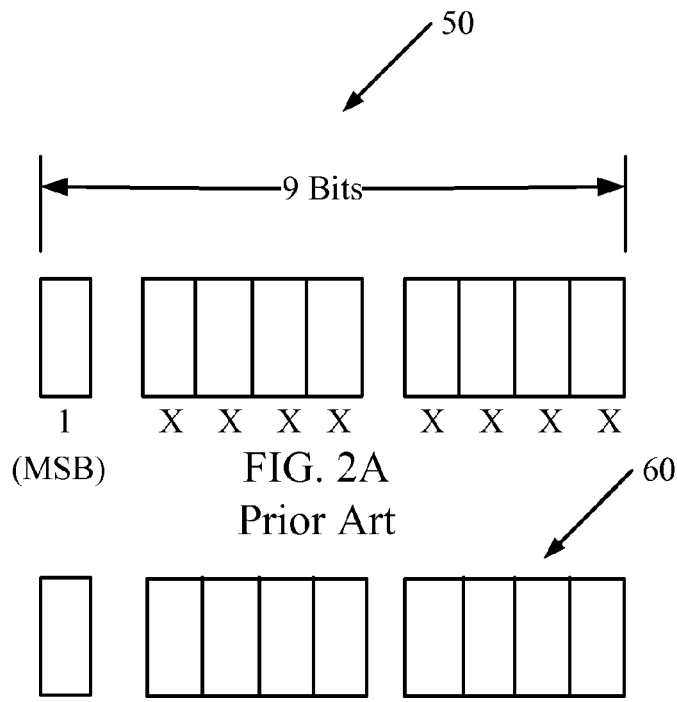
FIG. 2A
Prior Art
FIG. 2B
Prior Art

```
//range, offset both 9 bits
//range: 1 xxxx xxxx
//2^8<=range<2^9
//range>offset>=0
if(offset>=rMPS)
{//LPS case
   range_new=rLPS;
   offset_new=offset-rMPS;
}
else
{//MPS case
   range_new=rMPS;
   offset_new=offset;
}
```

ARCHITECTURE FOR MULTI-STAGE DECODING OF A CABAC BITSTREAM

CROSS-REFERENCE TO RELATED APPLICATIONS

The present Application for Patent claims priority benefit of commonly-assigned Provisional Application Ser. No. 60/969,565, filed Aug. 31, 2007 and Provisional Application Ser. No. 61/057,009 filed May 29, 2008. This provisional patent application is hereby expressly incorporated by reference herein.

BACKGROUND

I. Field

The present disclosure relates generally to the field of video decoding and, more specifically, to techniques for optimizing Context-based Adaptive Binary Arithmetic Coding (CABAC) bitstream decoding.

II. Background

H.264/AVC has two different entropy coding modes to generate the bitstream. AVC represents adaptive video coding. One coding mode is Context-based Adaptive Variable Length Coding (CAVLC), and the other coding mode is Context-based Adaptive Binary Arithmetic Coding (CABAC). CAVLC is similar to other variable length coding (VLC) schemes. Each syntax element is decoded from one or more integer number of bits.

CABAC decodes syntax elements very differently. Each syntax element can be decoded conceptually in two steps. In the first step, CABAC decodes one or more binary symbols using an adaptive binary arithmetic decoder. In the second step, a debinarization process is performed to reconstruct the value of syntax element, and this value is used in the remaining decoding steps of a video decoder. Depending on a bypass flag and context index, a binary symbol is decoded using one of three different decoding processes defined in the adaptive binary arithmetic coder, namely DecodeDecision, DecodeBypass, and DecodeTerminate.

In DecodeDecision, a binary symbol is decoded in the context of the information already decoded from the bitstream. In addition, the probability model of decoding the next binary symbol of the same category is updated based on the value of the binary symbol just decoded. In DecodeBypass, the symbol is decoded without referring to other information already decoded. In addition, there is no need to maintain a context model after the symbol is decoded. DecodeTerminate is similar to DecodeBypass, except that the process is so defined that decoding a symbol of one value consumes only a fractional amount of bits, while decoding a symbol of the other value consumes significantly more bits.

Since decoding a symbol, especially using the process DecodeDecision, requires several steps of serial operations, it is very difficult to speed up the overall CABAC decoding process. This has been a challenge in implementing the high-definition (HD) video decoder. Some compressed frames are too large. The CABAC decoder can take significantly more time to finish than other decoding stages. Thus, the overall performance of the decoder is affected.

The encoding process is the inverse of the decoding process. A CABAC encoder performs binarization to convert each syntax element into one or several binary symbols, and each binary symbol is encoded using one of three binary arithmetic coding processes, namely EncodeDecision, EncodeBypass and EncodeTerminate which correspond to DecodeDecision, DecodeBypass and DecodeTerminate, respectively.

One approach to the problem mentioned above is to transcode the CABAC bitstream into a bitstream without CABAC in the first stage and to perform the decoding of this non-CABAC bitstream and other processing steps in the second stage. Buffering is generally needed between these two stages. In the first stage, the operations normally involve decoding the values of the syntax elements from the CABAC bitstream and re-encoding the syntax elements using another entropy coding scheme, such as H.264 CAVLC or MPEG-2 like VLC encoder.

One problem with this transcoding approach is the complexity associated with the transcoding operations. The complete CABAC decoder essentially needs to be implemented with the overhead of another VLC encoder and VLC decoder. In addition, the compression efficiency of the VLC encoder may not be satisfactory to minimize the additional traffic.

There is therefore a continuing need for techniques for optimizing the Context-based Adaptive Binary Arithmetic Coding (CABAC) bitstream decoding.

SUMMARY

Techniques for optimizing the Context-based Adaptive Binary Arithmetic Coding (CABAC) bitstream decoding are provided. In one configuration, a device comprising a first decoder stage operable to decode a Context-based Adaptive Binary Arithmetic Coding (CABAC) bitstream into an intermediate signal having a CABAC decoded standard format and a decoded order is provided. The device further includes a buffer operable to buffer the intermediate signal in the decoded order and a second decoder stage operable to decode the intermediate signal into a video output signal using a non-CABAC decoding standard.

In another aspect, an integrated circuit comprising a first decoder circuit operable to decode a Context-based Adaptive Binary Arithmetic Coding (CABAC) bitstream into an intermediate signal having a CABAC decoded standard format and a decoded order is provided. The integrated circuit also includes a buffer operable to buffer the intermediate signal in the decoded order. A second decoder circuit is operable to decode the intermediate signal into a video output signal using a non-CABAC decoding standard.

In a further aspect, a computer program product is provided. The computer program product includes a computer readable medium having instructions for causing a computer to decode a Context-based Adaptive Binary Arithmetic Coding (CABAC) bitstream into an intermediate signal having a CABAC decoded standard format and a decoded order. The product also includes instructions to cause a computer to buffer the intermediate signal in the decoded order and to decode the intermediate signal into a video output signal using a non-CABAC decoding standard.

Additional aspects will become more readily apparent from the detailed description, particularly when taken together with the appended drawings.

BRIEF DESCRIPTION OF THE DRAWINGS

Aspects and configurations of the disclosure will become more apparent from the detailed description set forth below when taken in conjunction with the drawings in which like reference characters identify corresponding elements throughout.

FIG. 2A shows an exemplary H.264 standard range register.

FIG. 2B shows an exemplary H.264 standard offset register.

FIG. 2C shows an exemplary H.264 standard MPS case.

FIG. 2D shows an exemplary H.264 standard LPS case.

Figure 1:
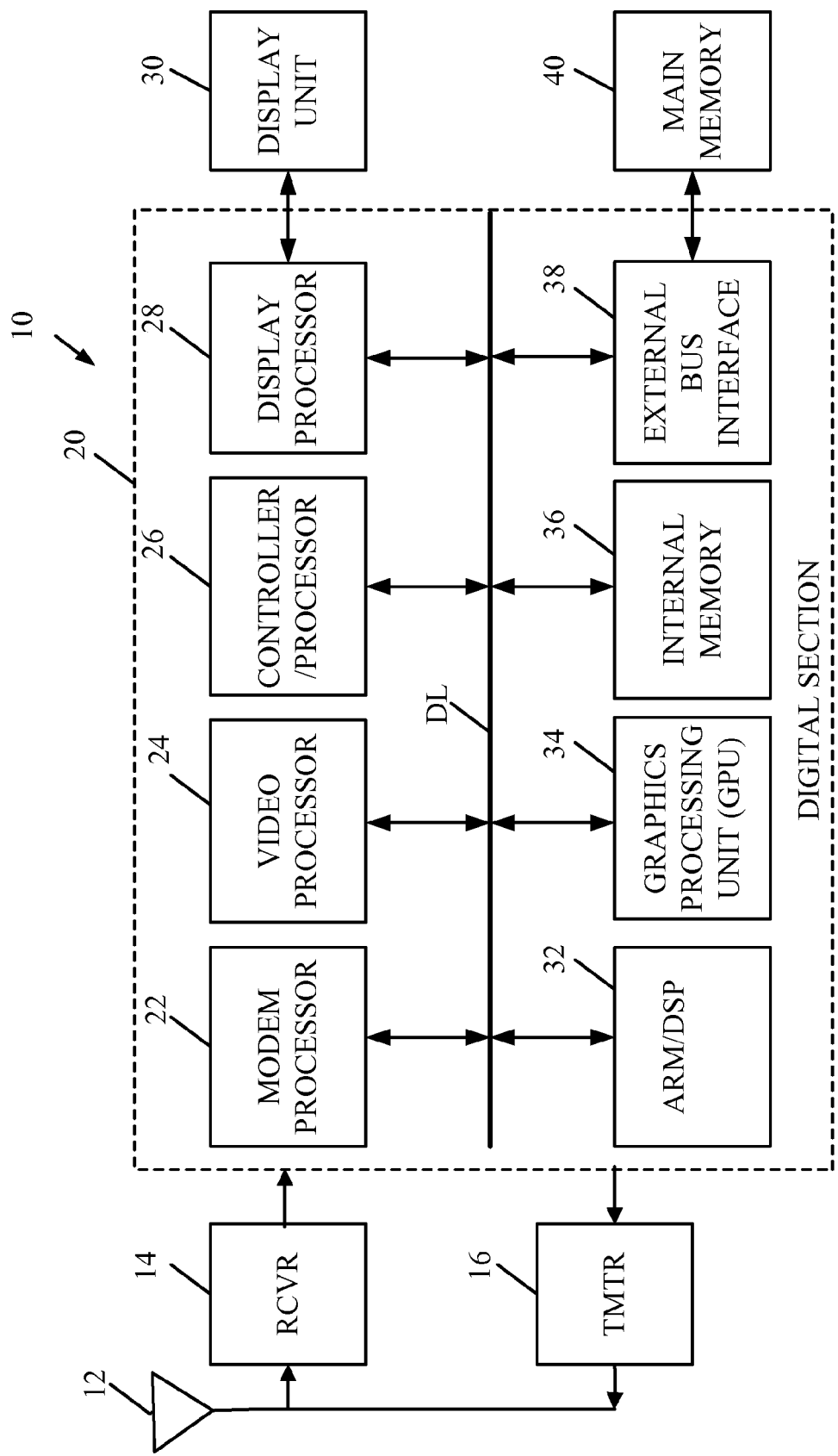
FIG. 1 shows a general block diagram of a wireless device.

The images in the drawings are simplified for illustrative purposes and are not depicted to scale. To facilitate understanding, identical reference numerals have been used, where possible, to designate identical elements that are common to the Figures, except that suffixes may be added, when appropriate, to differentiate such elements.

The appended drawings illustrate exemplary configurations of the invention and, as such, should not be considered as limiting the scope of the invention that may admit to other equally effective configurations. It is contemplated that features or steps of one configuration may be beneficially incorporated in other configurations without further recitation.

DETAILED DESCRIPTION

The word "exemplary" is used herein to mean "serving as an example, instance, or illustration." Any configuration or design described herein as "exemplary" is not necessarily to be construed as preferred or advantageous over other configurations or designs, and the terms "core", "engine", "machine", "processor" and "processing unit" are used interchangeably.

Video signals may be characterized in terms of a series of pictures, frames, and/or fields, any of which may further include one or more slices. As used herein, the term "frame" is a broad term that may encompass one or more of frames, fields, pictures and/or slices.

Embodiments include systems and methods that facilitate channel switching in a multimedia transmission system. Multimedia data may include one or more of motion video, audio, still images, text or any other suitable type of audio-visual data.

Multimedia processing systems, such as video encoders, may encode multimedia data using encoding methods based on international standards such as Moving Picture Experts Group (MPEG)-1, -2 and -4 standards, the International Telecommunication Union (ITU)-T H.263 standard, and the ITU-T H.264 standard and its counterpart, ISO/IEC MPEG-4, Part 10, i.e., Advanced Video Coding (AVC), each of which is fully incorporated herein by reference for all purposes. Such encoding, and by extension, decoding, methods generally are directed to compressing the multimedia data for transmission and/or storage. Compression can be broadly thought of as the process of removing redundancy from the multimedia data.

A video signal may be described in terms of a sequence of pictures, which include frames (an entire picture), or fields (e.g., an interlaced video stream comprises fields of alternating odd or even lines of a picture). Further, each frame or field may further include two or more slices, or sub-portions of the frame or field.

Multimedia processors, such as video encoders, may encode a frame by partitioning it into a subset of pixels. These subsets of pixels may be referred to as blocks or macroblocks and may include, for example, 16×16 pixels. The encoder may further partition each 16×16 macroblock into subblocks. Each subblock may further comprise additional subblocks. For example, subblocks of a 16×16 macroblock may include 16×8 and 8×16 subblocks. Each of the 16×8 and 8×16 subblocks may include, for example, 8×8 subblocks, which themselves may include, for example, 4×4, 4×2 and 2×4 subblocks, and so forth. As used herein, the term "block" may refer to either a macroblock or any size of subblock.

The techniques described herein may be used for wireless communications, computing, personal electronics, etc. An exemplary use of the techniques for wireless communication is described below. A communications system or network may comprise one or more of a wired or wireless communication system, including one or more of a Ethernet, telephone (e.g., POTS), cable, power-line, and fiber optic systems, and/or a wireless system comprising one or more of a code division multiple access (CDMA or CDMA2000) communication system, a frequency division multiple access (FDMA) system, an orthogonal frequency division multiple (OFDM) access system, a time division multiple access (TDMA) system such as GSM/GPRS (General packet Radio Service)/EDGE (enhanced data GSM environment), a TETRA (Terrestrial Trunked Radio) mobile telephone system, a wideband code division multiple access (WCDMA) system, a high data rate (1xEV-DO or 1xEV-DO Gold Multicast) system, an IEEE 802.11 system, a MediaFLO system, a DMB system, a DVB-H system, and the like.

FIG. 1 shows a block diagram of a configuration of a wireless device 10 in a wireless communication system or network. The wireless device 10 may be a cellular or camera phone, a terminal, a handset, a personal digital assistant (PDA), or some other device. The wireless communication system may be a Code Division Multiple Access (CDMA) system, a Global System for Mobile Communications (GSM) system, or some other system. A handset may be a cellular phone, wireless device, wireless communications device, a video game console, a wirelessly-equipped personal digital assistant (PDA), a laptop computer, or a video-enabled device.

The wireless device 10 is capable of providing bi-directional communications via a receive path and a transmit path. On the receive path, signals transmitted by base stations are received by an antenna 12 and provided to a receiver (RCVR) 14. The receiver 14 conditions and digitizes the received signal and provides samples to a digital section 20 for further processing. On the transmit path, a transmitter (TMTR) 16 receives data to be transmitted from the digital section 20, processes and conditions the data, and generates a modulated signal, which is transmitted via the antenna 12 to the base stations.

The digital section 20 includes various processing, interface and memory units such as, for example, a modem processor 22, a video processor 24, a controller/processor 26, a display processor 28, an ARM/DSP 32, a graphics processing unit (GPU) 34, an internal memory 36, and an external bus interface (EBI) 38. The modem processor 22 performs processing for data transmission and reception (e.g., encoding, modulation, demodulation, and decoding). The video processor 24 performs processing on video content (e.g., still images, moving videos, and moving texts) for video applications such as camcorder, video playback, and video conferencing. The controller/processor 26 may direct the operation of various processing and interface units within digital section 20. The display processor 28 performs processing to facilitate the display of videos, graphics, and texts on a display unit 30. The ARM/DSP 32 may perform various types of processing for the wireless device 10. The graphics processing unit 34 performs graphics processing.

The techniques described herein may be used for any of the processors in the digital section 20, e.g., the video processor 24. The internal memory 36 stores data and/or instructions for various units within the digital section 20. The EBI 38 facilitates the transfer of data between the digital section 20 (e.g., internal memory 36) and a main memory 40 along a bus or data line DL.

The digital section 20 may be implemented with one or more DSPs, micro-processors, RISCs, etc. The digital section 20 may also be fabricated on one or more application specific integrated circuits (ASICs) or some other type of integrated circuits (ICs).

The techniques described herein may be implemented in various hardware units. For example, the various illustrative logical blocks, components, modules, and circuits described in connection with the examples disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. The processor may also include RISCs, ARMs, digital signal processing devices (DSPDs), programmable logic devices (PLDs).

The blocks of a process or algorithm described in connection with the examples disclosed herein may be embodied directly in hardware, in one or more software modules executed by one or more processing elements, or in a combination of the two. A software module may reside in RAM memory, flash memory, ROM memory, EPROM memory, EEPROM memory, registers, hard disk, a removable disk, a CD-ROM, or any other form or combination of storage medium known in the art. An example storage medium is coupled to the processor such that the processor can read information from, and write information to, the storage medium. In the alternative, the storage medium may be integral to the processor. The processor and the storage medium may reside in an Application Specific Integrated Circuit (ASIC). The ASIC may reside in a wireless modem. In the alternative, the processor and the storage medium may reside as discrete components in the wireless modem.

FIGS. 2A-2D and 3-7, as described below, are related to the H.264 standard such as for decoding a CABAC bitstream. FIGS. 2A-2D and 3-7 disclose generic principles defined by the H.264 standard that may be applied to the configurations of FIGS. 8-11.

FIG. 2A shows an exemplary H.264 standard range register 50 and FIG. 2B shows an exemplary H.264 standard offset register 60. The basic idea of the binary arithmetic coding process is recursive interval division. The arithmetic decoding engine core keeps two registers. The first register is a range register 50 with 9-bits. The second register is an offset register 60 which is 9-bits in a regular mode and 10-bits in a bypass mode.

FIG. 2C shows an exemplary H.264 standard most probability symbol (MPS) case and FIG. 2D shows an exemplary H.264 standard least probability symbol (LPS) case. The range register 50 keeps track of the width, denoted by the total distance of the subinterval rLPS 52 and subinterval rMPS 54, of the current interval. The offset is from the bit-stream and a point to the current location within the range. It should be noted that many of the equations and expressions set forth below use syntax similar to C or C++ computer programming language. The expressions are for illustrative purposes and can be expressed in other computer programming languages with different syntax.

When decoding a bin, the range is divided into two sub-intervals rLPS 52 and rMPS 54 depending on the context to decode a specific bin. A bin is a CABAC decoded standard format. As will be seen from the description below, a bin when decoded is a binary symbol. The subintervals rLPS 52 and rMPS 54 are defined in equation Eqs. (1) and (2)

$$rLPS = \text{range} * pLPS, \text{ and} \quad (1)$$

$$rMPS = \text{range} * pMPS = \text{range} * (1 - pLPS) = \text{range} - rLPS, \quad (2)$$

where pLPS is the probability of the least probability symbol; and pMPS is the probability of the most probability symbol. The subinterval rLPS 52 and rMPS 54 where the offset falls, decides whether the bin is a MPS or a LPS bin. If the offset is >=rMPS, the bin is a LPS bin. Otherwise, the bin is a MPS bin. After the bin is decided, the range and offset are updated. The term pMPS is the probability. The probability should within 0 to 1. The term rMPS is the range*pMPS. The summation of the probabilities of MPS and LPS should be equal to 1.

In various configurations below, flowchart blocks are performed in the depicted order or these blocks or portions thereof may be performed contemporaneously, in parallel, or in a different order.

Figure 3:
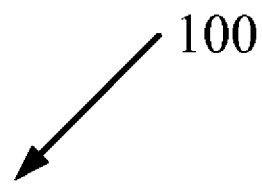
FIG. 3 shows a sample (psuedocode) instruction set of a H.264 standard arithmetic decoding process for one bin.

FIG. 3 showsa sample (psuedocode) instruction set of a H.264 standard arithmetic decoding process 100 for one bin. The instruction set indicates that both the range register 50 and offset register 60 are 9 bits. The range register 50 configuration is also indicated. The instruction set indicates that the range is within $2^8 <= \text{range} < 2^9$. The arithmetic decoding process 100 is abbreviated and begins at an instruction where a determination is made whether range is >offset>=0. If the determination is "No," the process 100 ends. However, if the determination is "Yes," the next set of instructions is an if-else set. The if statement checks to see if the offset is >=rMPS. If the determination is "Yes," the bin is a LPS case. Then the range is updated to a new range (range_new) set equal to the subinterval rLPS (FIG. 2D) and the new offset (offset_new) is set equal to offset −rMPS.

If the if condition is "No," then the bin is a MPS case. Then the range is updated to a new range (range_new) set equal to the subinterval rMPS and the new offset (offset_new) is set equal to offset.

Figure 4:
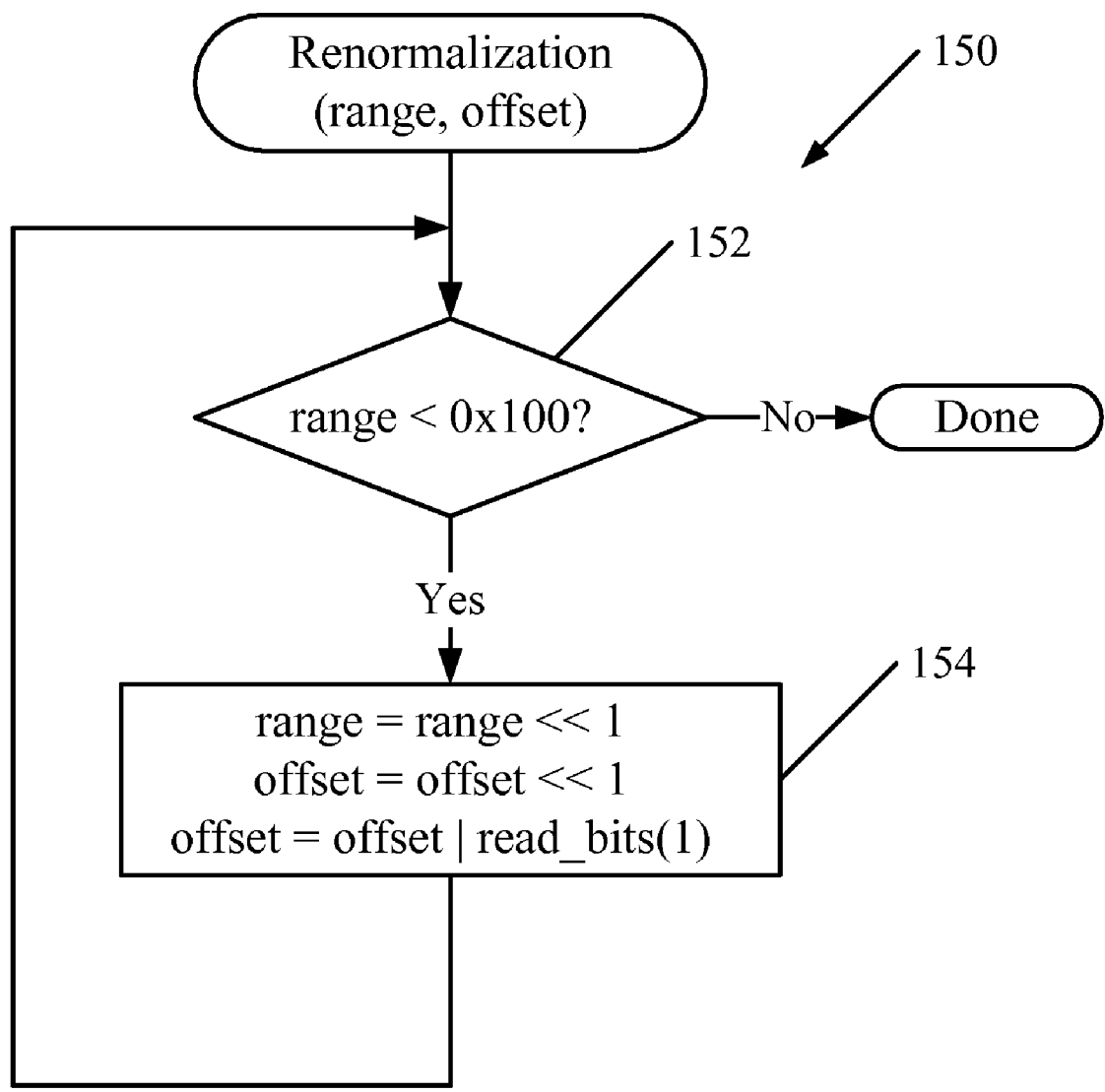
FIG. 4 shows a flowchart of a H.264 standard renormalization process.

FIG. 4 shows a flowchart of a H.264 standard renormalization process 150. After decoding one bin, the range and the offset will be renormalized to keep the precision to decode the next bin. The standard renormalization process 150 ensures that the most significant bit (MSB) of the 9-bit range register 50 is always 1, as represented in FIG. 2A. The standard renormalization process 150 begins with block 152 where a decision is made whether the range is <0X100. At block 152, the value of the range is compared with 256 (or 0x100). If the determination is "No," the process 150 ends. However, if the determination at block 152 is "Yes," then block 152 is followed by block 154. At block 154, the range is left shifted by one bit denoted by range=range<<1. Likewise, the offset is left shifted by one bit, denoted by offset=offset<<1. The offset is also set to offset (bitwise OR) read_bits (1). The expression offset (bitwise OR) read_bits (1) represents the value of the RANGE/OFFSET registers shifted left by one bit. After the shift, the least significant(right most) bit is 0. The expression read_bits (1) reads one bit from the bitstream and this one bit is added to the least significant(right most) bit of offset register 60.

Block 154 loops back to block 152 described above. The loop of blocks 152 and 154 are repeated until the determination at block 152 is "No," which completes the renormalization process 150.

Figure 5:
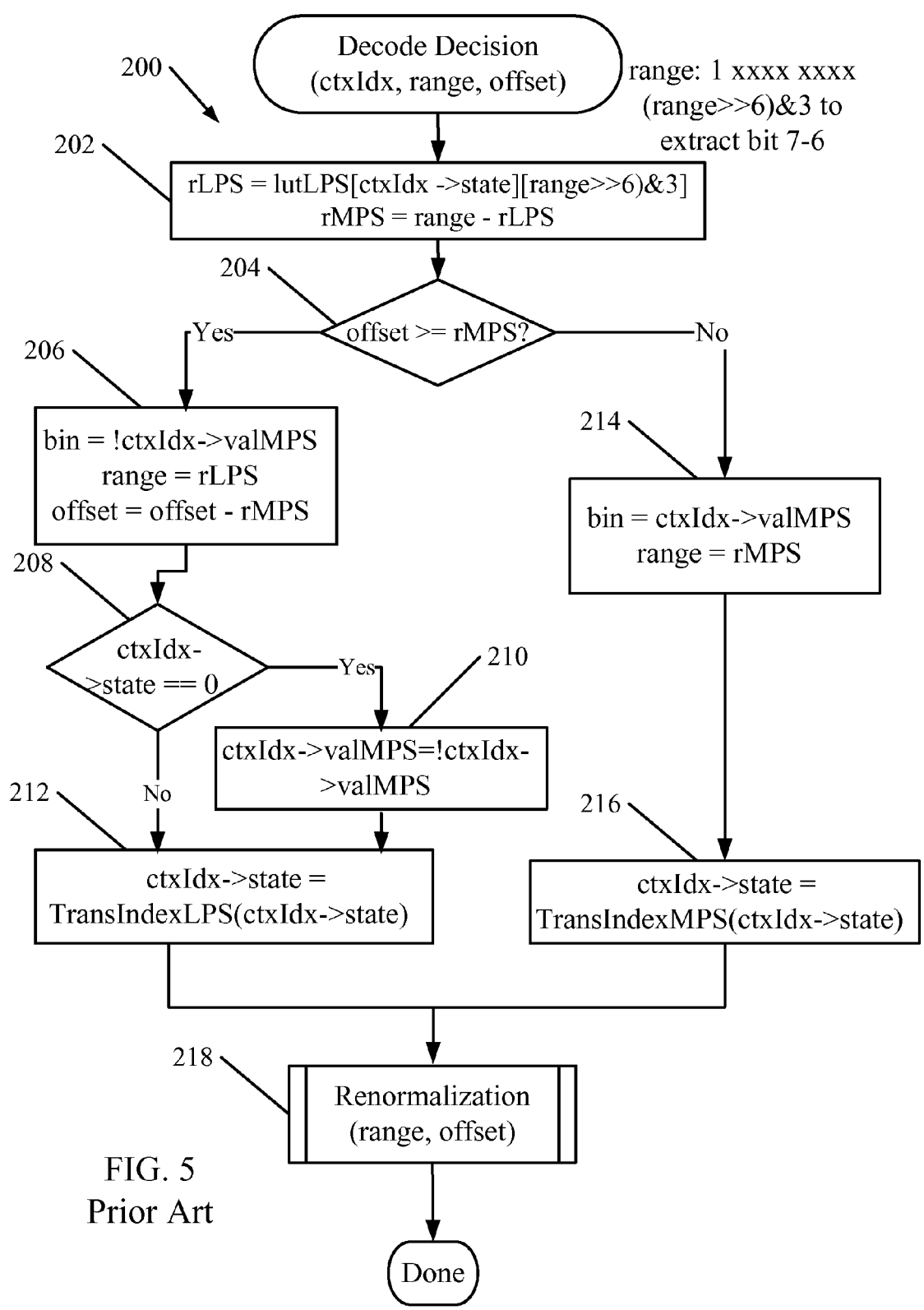
FIG. 5 shows a flowchart of a H.264 standard normal decoding mode process (DecodeDecision).

FIG. 5 shows a flowchart of a H.264 standard normal decoding mode process 200. In the standard decoding process 200, to avoid multiplication, a 64×4 look up table (LUT) is used to approximate the rLPS set forth in equation Eq. (1) above. The range is approximated by equal-partitions of the 9-bit range register 50 into four cells. The pLPS is approximated by 64 quantized values indexed by a 6-bit context state. Therefore, at block 202, the rLPS is calculated according to equation Eq. (3)

$$rLPS=lutLPS[ctxIdx\text{->}state][(range\text{>>}6)\&3] \quad (3)$$

where ctxIdx is an input to the process 200, represents the index to the context state and provides state information; range>>6 represents a right shift by 6 bits or a division by $2^6$; and the result of (range>>6)&3 extracts bits 7-6 (the 2 bits after the MSB) in the range register 50 used to address the LUT. The expression ctxIdx->state can take a value from 0 to 63 which is used in the 64×4 LUT to get the rLPS. For example, if a range is 0b1 xx yy yyyy, the range will be within 0x100 to 0x1FE, and (range>>6)&3 is used to get "xx" of the range. The expression & is a bitwise AND function.

At block 202, the rMPS is also calculated according to equation Eq. (4)

$$rMPS=range-rLPS \quad (4)$$

where rLPS is calculated in equation Eq. (3).

Block 202 is followed by block 204 where a determination is made whether the offset>=rMPS. If the determination is "Yes," then block 204 is followed by block 206 where the bin, range and offset are calculated according to equations Eq. (5), (6) and (7)

$$bin=!ctxIdx\text{->}valMPS \quad (5)$$

$$range=rLPS, \text{ and} \quad (6)$$

$$offset=offset-rMPS \quad (7)$$

where !ctxIdx->valMPS denotes an expression where ctxIdx->valMPS can take a value 0 or 1, and "!" means bit flip. The term ctxIdx is the input parameter to the function, and it provides the state and valMPS information. The term valMPS represents the bin output in the MPS case.

Block 206 is followed by block 208 where a determination is made whether ctxIdx->state is equal to 0. If the determination at bock 208 is "Yes," then block 208 is followed by block 210 where ctxIdx->valMPS is assigned to equal !ctxIdx->valMPS. Block 210 is followed by block 212. Additionally, if the determination at block 208 is "No," then block 208 is also followed by block 212. At block 212, ctxIdx->state is assigned to equal TransIndexLPS (ctxIDx->state). After each bin is decoded, the state/valMPS associated with each ctxIdx needs to be updated. The terms TransIndexLPS/TransIndexMPS are just 2 LUTs defined in the H.264 standard to calculate the state transition.

Returning again to block 204, if the determination at block 204 is "No," then block 204 is followed by block 214 where bin and range are calculated according to equations Eq. (8) and (9)

$$bin=ctxIdx\text{->}valMPS; \text{ and} \quad (8)$$

$$range=rMPS. \quad (9)$$

Block 214 is followed by block 216 where ctxIdx->state is assigned to equal TransIndexLPS(ctxIDx->state). Both blocks 212 and 216 proceed to block 218 where the renormalization process 150 takes place. Block 218 ends the process 200.

Figure 6:
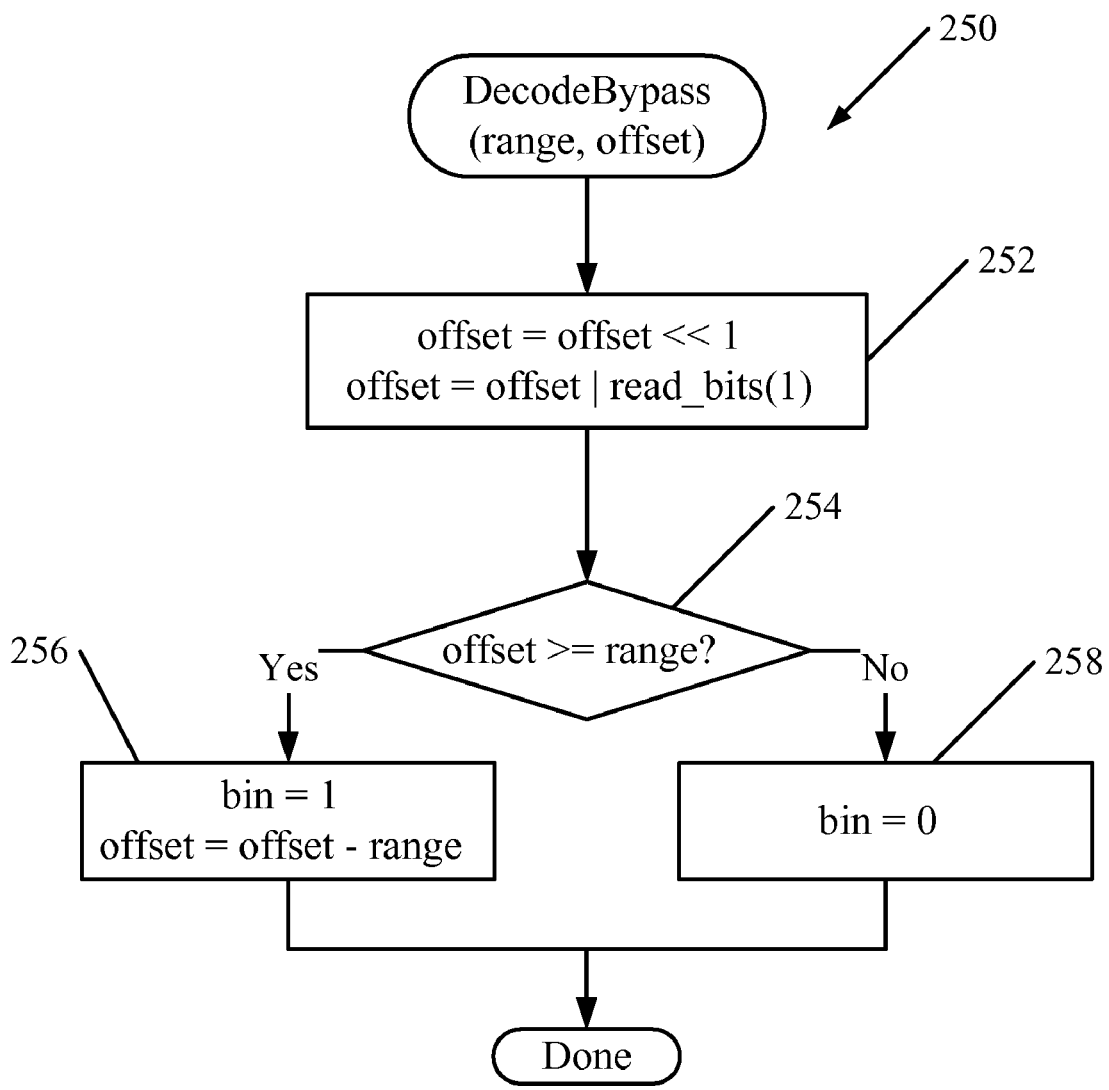
FIG. 6 shows a flowchart of a H.264 standard bypass decoding mode process (DecodeBypass).

FIG. 6 shows a general flowchart of a H.264 standard bypass decoding mode process 250. For the bypass decoding mode process 250. In the H.264 standard bypass decoding mode process 250, the offset is shifted left by 1 bit and 1 bit is read from the bit stream. The new offset is compared with the range to determine whether the bin is 1 or 0.

The standard bypass decoding mode process 250 begins with block 252 where the offset is set equal to offset <<1 where <<1 represents multiply by 2 or a left shift by 1. Furthermore offset is set equal to offset (bitwise OR) read_bits(1). Block 252 is followed by block 254 where a determination is made whether offset is >=range. If the determination is "Yes," then block 254 is followed by block 256 where the bin and offset are calculated according to equations Eq. (10) and (11)

$$Bin=1; \text{ and} \quad (10)$$

$$Offset=offset-range. \quad (11)$$

If the determination is "No," then block 254 is followed by block 258 where the bin is set equal to zero (0). Blocks 256 and 258 end the process 250. It should be noted that the term bin is also the same as bit.

Figure 7:
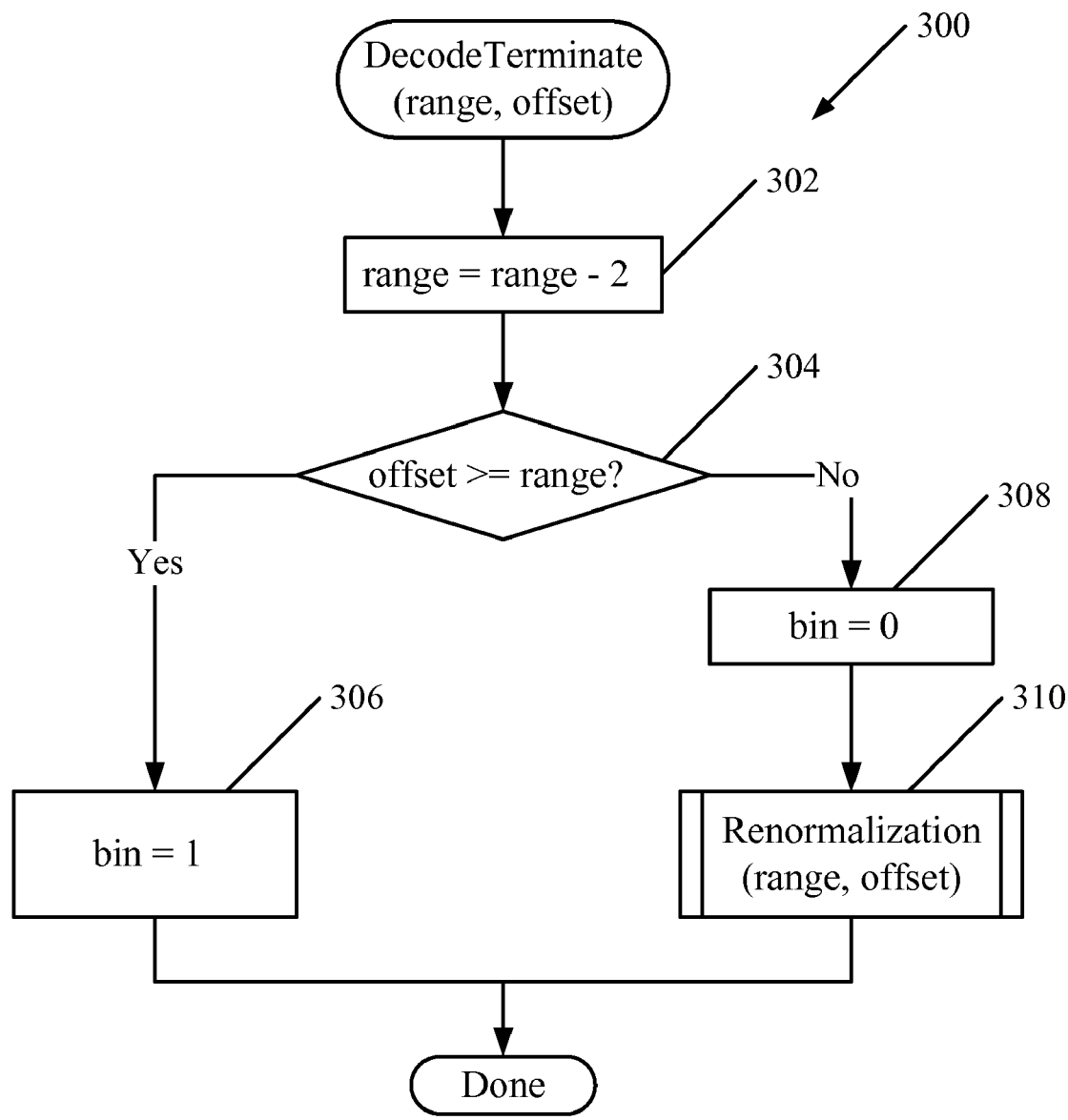
FIG. 7 shows a flowchart of a H.264 standard terminate decoding mode process (DecodeTerminte).

FIG. 7 shows a flowchart of a H.264 standard terminate decoding process 300. When decoding the bin indicating the end_of_slice_flag and the I-Pulse Code Modulation (I_PCM) mode, a special decoding routine the standard terminate decoding process 300 is called. The standard terminate decoding process 300 begins with block 302 where the range is decremented by 2 (range=range-2). Block 302 is followed by block 304 where a determination is made whether the offset is >=range. If the determination at block 304 is "Yes," then the bin is set equal to one (1) at block 306. However, if the determination at block 304 is "No," then block 304 is followed by block 308 where the bin is set equal to zero (0). Block 308 is followed by block 310 where the renormalization process 150 (FIG. 4) is performed. Both blocks 306 and 310 end the H.264 standard terminate decoding process 300.

During the CABAC initial stage, the range register 50 (FIG. 2A) is set to 0x1FE, 9 bits are read from the bitstream to set the initial offset register 60.

As can be readily seen from above, the 9 bits are used to represent both the range and offset. Therefore, there are a great number of bit wise operations in the CABAC core processes.

In the H.264 standard normal decoding mode process 200 (FIG. 5), whenever an LPS case, since the LPS probability is <0.5, the new range will be <0x100. Thus, renormalization is needed to bring the range >=0x10. In the new exemplary configuration, a count_leading_zero (CLZ) instruction is used to calculate the amount of left shift needed instead of using a loop. Whenever a MPS case, since the MPS probability is >=0.5, the new range will be from 0x080 to 0x1FE. Therefore, at most one left shift is needed for renormalization to bring the most significant bit (MSB) to 1. At the same time, the offset is left shifted by the same amount and new bits are read from the bit stream to fill it up.

Moreover, in the H.264 standard bypass decoding mode process 250, the offset is always left shifted by 1 and 1 bit is read from the bitstream. This requires very frequent renormalization and reading of bits from the bit-stream both of which are very computationally costly.

Figure 8:
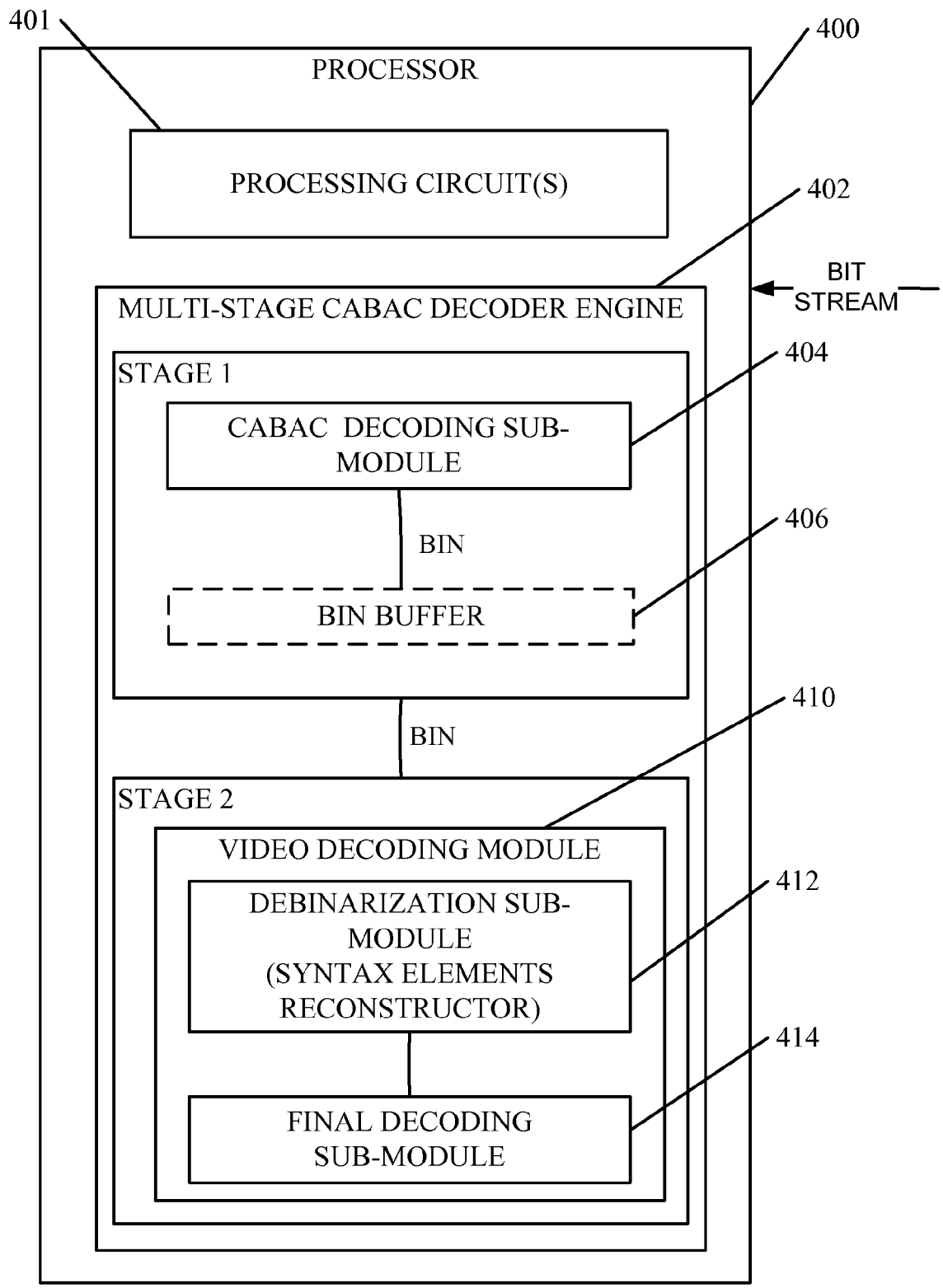
FIG. 8 shows a general block diagram of a processor performing multi-stage decoding of a CABAC bitstream.

FIG. 8 shows a general block diagram of a processor 401 performing multi-stage decoding of a received CABAC bitstream (BS). The processor 401 includes a processing circuit 401 and a multi-stage CABAC decoder engine 402. In one aspect, the multi-stage CABAC decoder engine 402 is implemented in two stages. In the first stage (STAGE 1), the CABAC bitstream is decoded only into bins or binary symbols by a CABAC decoding sub-module 404. The bins or binary symbols may be buffered in a bin buffer 406 in the exact order (hereinafter referred to as a "decoded order") as they are decoded from the CABAC bitstream. Further, processing in the first stage is not generally performed after buffering. The bin buffer 406 is shown in phantom to denote that the memory for storing the bins or binary symbols is external to the processor 400.

The output of the CABAC decoding sub-module 40 is an intermediate signal and is a CABAC decoded standard format. In general, the operations of the CABAC decoding sub-module 404 can be slow depending on at least the size of the frame.

In the second stage (STAGE 2) of the multi-stage CABAC decoder engine 402, a video decoding sub-module 410 decodes the intermediate signal from the bin buffer 406 and may include a variable length coding (VLC) decoder. The video decoding sub-module 410 includes a debinarization sub-module 412 operable to reconstruct the values of the syntax elements from the intermediate signal. The syntax elements are then used any remaining decoding operations of the video decoding sub-module 410 in a final decoding sub-module 414 to produce a video output.

Figure 9:
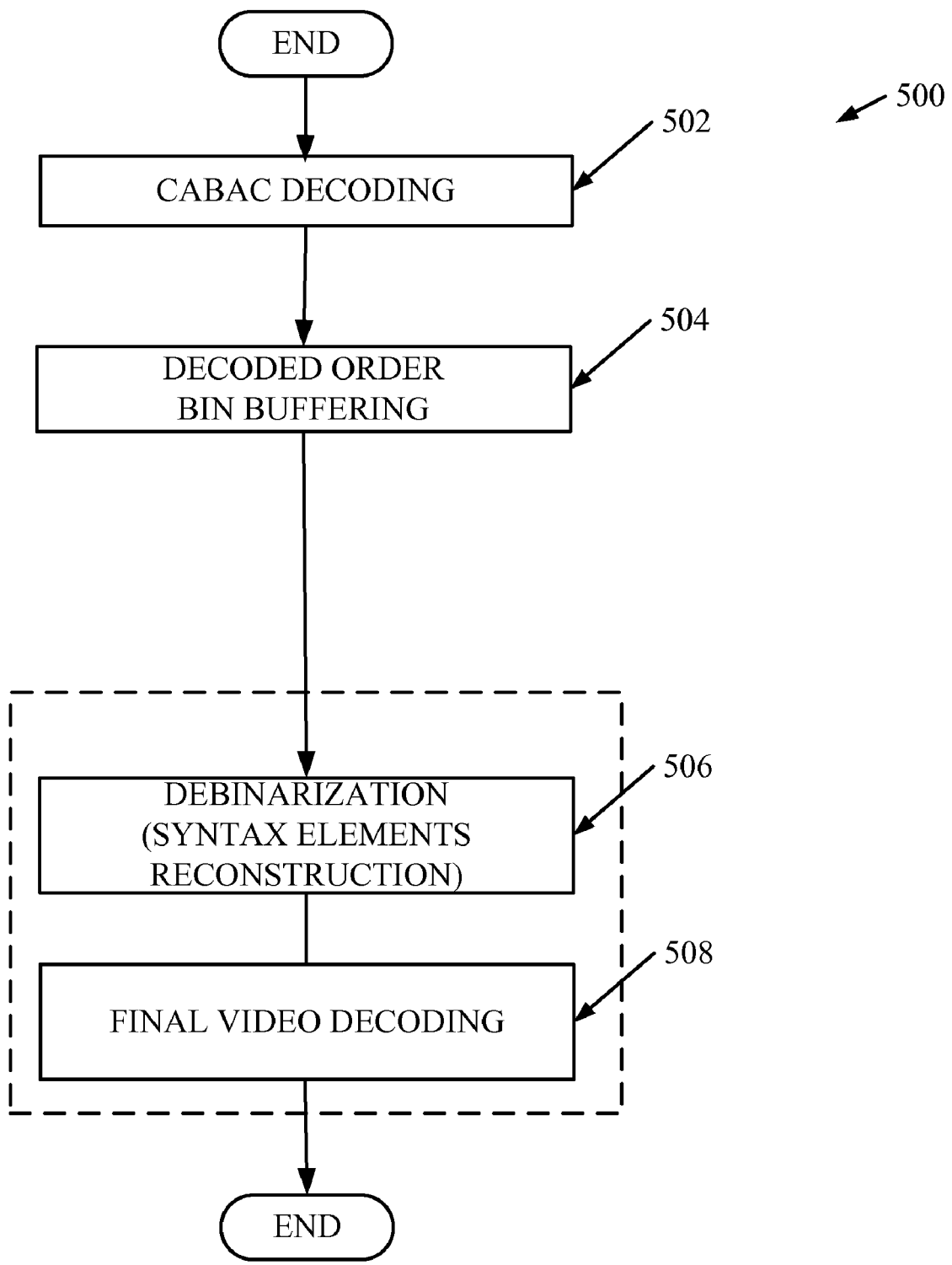
FIG. 9 shows a flowchart of a CABAC bitstream multi-stage decoding process.

FIG. 9 shows a flowchart of a CABAC bitstream multi-stage decoding process 500 according to the aspect shown in FIG. 8. The process 500 begins with block 502 where a CABAC bitstream is decoded into an intermediate signal having only bins or binary symbols having a CABAC decoded standard format. Block 602 is followed by block 604 where the binary symbols are buffered in the decoded order which is the exact order as the bins are decoded. Block 604 is followed by block 606. At block 606, syntax elements reconstruction takes place. Block 606 is followed by block 608 where any final video decoding operations take place to produce a video output signal.

Figure 10:
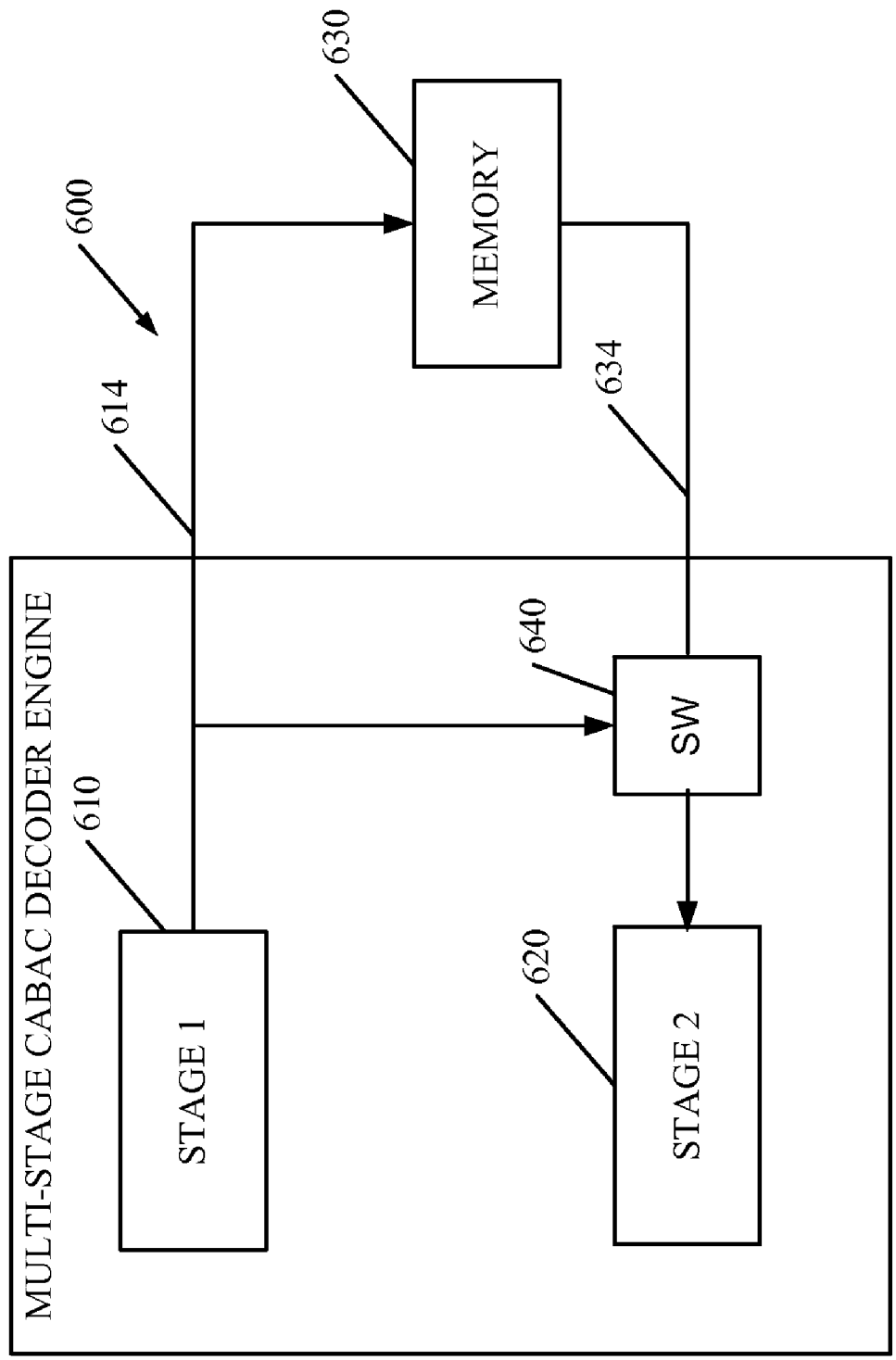
FIG. 10 shows a general block diagram of a multi-stage CABAC decoder engine with a bypass mode.

FIG. 10 shows a general block diagram of a multi-stage CABAC decoder engine 600 with a bypass mode. The multi-stage CABAC decoder engine 600 includes first and second processing stages 610 and 620, an external memory 630 and a switch 640. In operation, the output of the first processing stage 610 is sent to the memory 630 on line 614. When the second processing stage 620 is ready to read the data of the buffered intermediate signal in the memory 630, the data is sent to the second processing stage 620 on line 634.

The first processing stage 610 and the second processing stage 620 may be separate processing circuits each having their own independent processing speed and processing performance. The first processing stage 610 has a first processing speed and a first performance. The second processing stage 620 has a second processing speed and a second processing performance. The first and second processing speeds may be the same or different. For example, the first processing speed or performance of the first processing stage 610 may be slower than the second processing speed or performance of the second processing stage 620. Nonetheless, the resultant processing performance of first processing stage 610 may diminish as the result of a frame size and/or the implementations of the CABAC decoding process.

The switch 640 is operable to pass the buffered intermediate signal stored in the memory 630 when in a non-bypass mode. The non-bypass mode is necessary when the processing speed or performance of the first stage 610 is below a predetermined threshold. Alternately, the switch 640 is operable to pass the intermediate signal directly from the first processing stage 610 to the second processing stage 620 when the processing speed or performance is above the predetermined threshold. Thus, the engine 600 switches to bypass mode.

In one aspect, the first processing stage 610 and the second processing stage 620 are implemented in software where the first processing stage 610 is implemented using a first instruction set (e.g. software or source code) and the second processing stage 620 is implemented using a second instruction set (e.g. software or source code). The first instruction set is separate and distinct from the second instruction set.

In another aspect, the first processing stage 610 is implemented in hardware and the second processing stage 620 is implemented in software. In a still further aspect, the first processing stage 610 is implemented in software and the second processing stage 620 is implemented in hardware.

In one aspect, the second processing stage 620 receives and decodes the intermediate signal in decoded order from the first processing stage 610 or the memory 630.

Figure 11:
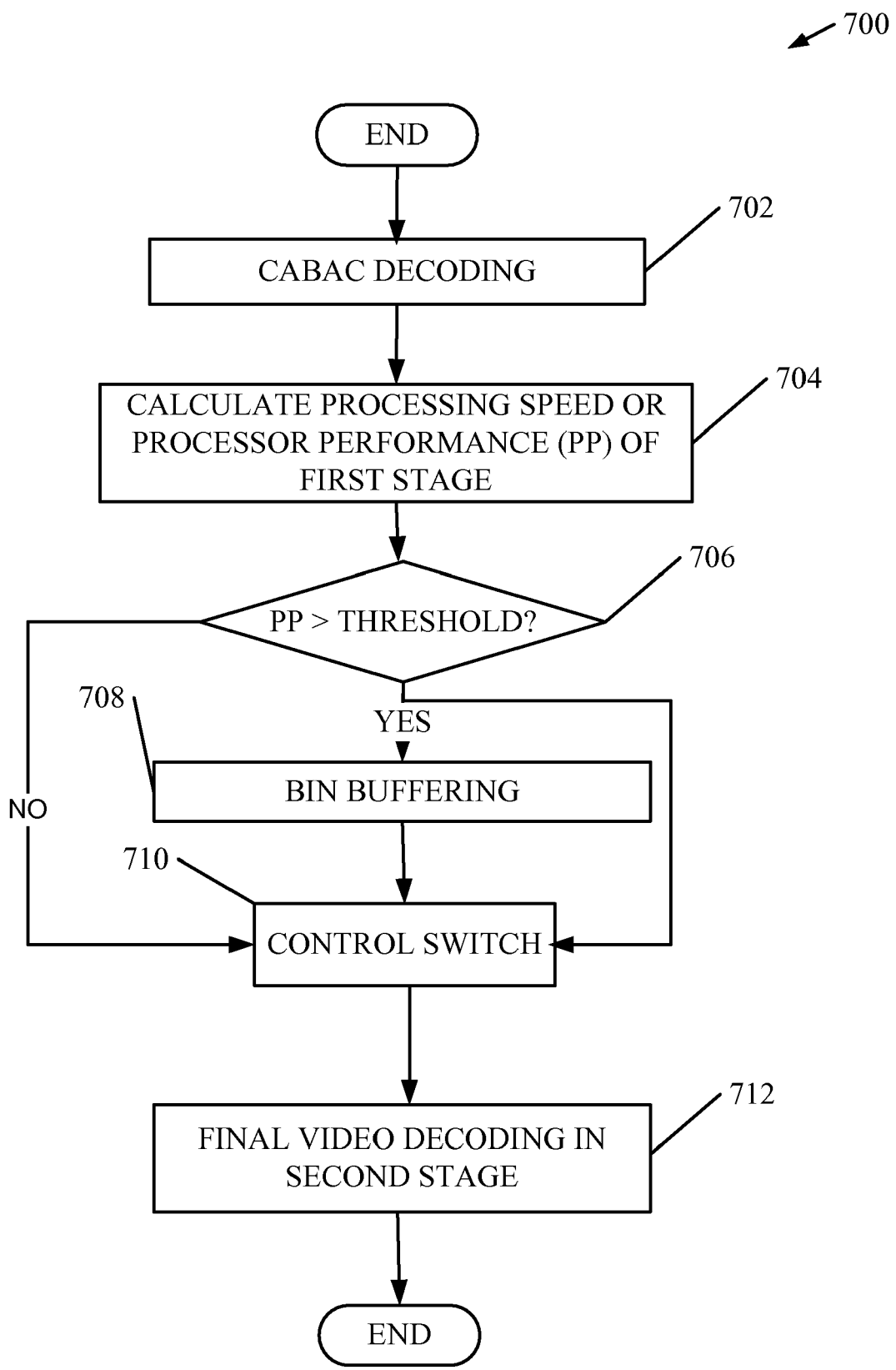
FIG. 11 shows a flowchart of a CABAC bitstream multi-stage decoding process with a bypass mode.

FIG. 11 shows a flowchart of a CABAC bitstream multi-stage decoding process 700 with a bypass mode. The process 700 begins with CABAC decoding at block 702 of a received bitstream. The CABAC decoding takes place in the first processing stage 610 arranged to only decode the bitstream in accordance with a CABAC decoding standard. Block 702 is followed by block 704 where the processing speed and/or processor performance (PP) of the first processing stage 610 is calculated. Block 704 is followed by block 706 where a determination is made whether the PP is greater than a predetermined threshold. If the determination at block 706 is "YES," then block 706 is followed by block 708 where bin buffering takes place. The intermediate signal is buffered in the exact decoded order.

Block 708 is followed by block 710 where the switch 640 is controlled to switch between the bypass mode and the non-bypass modes. Block 710 is followed by block 712 where video decoding takes place to produce a video output signal using a non-CABAC decoding standard. Returning again to block 706, if the determination at block 706 is "NO," then block 706 is followed directly by block 710 where the switch is changed to the bypass mode. In the bypass mode, the intermediate signal having a CABAC decoded standard format is immediately decoded by the second processing stage 620 in accordance with a second decoding process based on a non-CABAC decoding standard without the need for buffering.

The objective is to seek a trade-off between the coding efficiency and computation complexity. In the configuration of FIG. 11, the processing speed or performance is determined dynamically. The check may be performed periodically or at other designated intervals.

The 402 or 600 may be implemented in a Video Bitstream Parser as part of a high definition (HD) decoder or other integrated circuits.

In one or more exemplary configurations, the functions and/or blocks described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed configurations is provided to enable any person skilled in the art to make or use the disclosure. Various modifications to these configurations will be readily apparent to those skilled in the art, and the generic principles defined herein may be applied to other configurations without departing from the spirit or scope of the disclosure. Thus, the disclosure is not intended to be limited to the configurations shown herein but is to be accorded the widest scope consistent with the principles and novel features disclosed herein.

What is claimed is:

1. A device comprising:
   a first decoder stage operable to decode a Context-based Adaptive Binary Arithmetic Coding (CABAC) bitstream into an intermediate signal having a CABAC decoded standard format and a decoded order;
   a buffer operable to buffer the intermediate signal in the decoded order; and
   a second decoder stage operable to decode the intermediate signal into a video output signal using a non-CABAC decoding standard; and
   a switch, coupled between the first decoder stage and the second decoder stage, and being operable to directly pass the intermediate signal from the first decoder stage to the second decoder stage in a bypass mode and operable to pass the intermediate signal from the buffer to the second decoder stage in a non-bypass mode.

2. The device according to claim 1, wherein the second decoder stage is operable to reconstruct syntax elements from the intermediate signal and decode the syntax elements.

3. The device according to claim 2, wherein the second decoder stage includes a debinarization sub-module to reconstruct values of the syntax elements.

4. The device according to claim 3, wherein the second decoder stage includes a variable length coding decoder.

5. The device according to claim 1, wherein the intermediate signal includes bins.

6. The device according to claim 1, further comprising: a processor performance calculator operable to calculate a processor performance of the first decoder stage; and mode control to control the operation of the switch in response to the calculated processor performance.

7. The device according to claim 1, wherein the device is a cellular phone, a wireless device, a wireless communications device, a video game console, a wirelessly-equipped personal digital assistant (PDA), a laptop computer, or a video-enabled device.

8. An integrated circuit comprising:
   a first decoder circuit operable to decode a Context-based Adaptive Binary Arithmetic Coding (CABAC) bitstream into an intermediate signal having a CABAC decoded standard format and a decoded order;
   a buffer operable to buffer the intermediate signal in the decoded order; and
   a second decoder circuit operable to decode the intermediate signal into a video output signal using a non-CABAC decoding standard; and
   a switch, coupled between the first decoder circuit and the second decoder circuit, and being operable to directly pass the intermediate signal from the first decoder circuit to the second decoder circuit in a bypass mode and operable to pass the intermediate signal from the buffer to the second decoder circuit in a non-bypass mode.

9. The integrated circuit according to claim 8, wherein the second decoder circuit is operable to reconstruct syntax elements from the intermediate signal and decode the syntax elements.

10. The integrated circuit according to claim 9, wherein the second decoder circuit includes a debinarization sub-module to reconstruct values of the syntax elements.

11. The integrated circuit according to claim 10, wherein the second decoder circuit includes a variable length coding decoder.

12. The integrated circuit according to claim 8, wherein the intermediate signal includes bins.

13. The integrated circuit according to claim 8, further comprising: a processor performance calculator operable to calculate a processor performance of the first decoder circuit; and mode control to control the operation of the switch in response to the calculated processor performance.

14. The integrated circuit according to claim 8, wherein the integrated circuit is a portion of a cellular phone, a wireless device, a wireless communications device, a video game console, a wirelessly-equipped personal digital assistant (PDA), a laptop computer, or a video-enabled device.

15. An integrated circuit comprising:
   means for decoding a Context-based Adaptive Binary Arithmetic Coding (CABAC) bitstream into an intermediate signal having a CABAC decoded standard format and a decoded order;
   means for buffering the intermediate signal in the decoded order; and means for decoding the intermediate signal into a video output signal using a non-CABAC decoding standard; and means for switching to pass the intermediate signal from the means for decoding the CABAC bitstream directly to the means for decoding the intermediate signal in a bypass mode and to pass the intermediate signal from the means for buffering to the means for decoding the intermediate signal in a non-bypass mode.

16. The integrated circuit according to claim 15, wherein the means for decoding the intermediate signal includes means for reconstructing syntax elements from the intermediate signal and decoding the syntax elements.

17. The integrated circuit according to claim 16, wherein the means for decoding the intermediate signal includes a variable length coding decoder.

18. The integrated circuit according to claim 15, wherein the intermediate signal includes bins.

19. The integrated circuit according to claim 15, further comprising:

means for calculating a processor performance of the means for decoding the CABAC bitstream; and means for controlling the operation of the switch in response to the calculated processor performance.

20. A computer program product including a computer readable medium having instructions for causing a computer to:

decode a Context-based Adaptive Binary Arithmetic Coding (CABAC) bitstream into an intermediate signal having a CABAC decoded standard format and a decoded order;

buffer the intermediate signal in the decoded order;

decode the intermediate signal into a video output signal using a non-CABAC decoding standard;

calculate a processor performance of a processor decoding the CABAC bitstream; and switch, in response to the calculated processor performance, between a non-bypass mode and a bypass mode wherein in the non-bypass mode, the instructions to decode the intermediate signal include instructions to decode the buffered intermediate signal and, in the bypass mode, the instructions to decode the intermediate signal directly.

21. The computer program product according to claim 20, wherein the instructions to decode the intermediate signal include instruction to cause the computer to reconstruct syntax elements from the intermediate signal and decode the syntax elements.

22. The computer program product according to claim 21, wherein the instructions to decode the intermediate signal include instructions to cause the computer to decode the intermediate signal according to a variable length coding scheme.

23. The computer program product according to claim 20, wherein the intermediate signal includes bins.

24. A method comprising:

decoding, by a first processing stage, a Context-based Adaptive Binary Arithmetic Coding (CABAC) bitstream into an intermediate signal having a CABAC decoded standard format and a decoded order;

buffering the intermediate signal in the decoded order; and decoding, by a second processing stage, the intermediate signal into a video output signal using a non-CABAC decoding standard;

selectively bypassing the buffering in a bypass mode; and directly passing the intermediate signal from the first processing stage to the second processing stage in the bypass mode.

25. The method according to claim 24, wherein the decoding of the intermediate signal includes reconstructing syntax elements from the intermediate signal and decoding the syntax elements.

26. The method according to claim 25, wherein the decoding of the intermediate signal includes a variable length coding decoding.

27. The method according to claim 24, further comprising:

calculating a processor performance of the first processing circuit; and controlling the selectively bypassing in response to the calculated processor performance.

* * * * *